United States Patent [19]
Arai et al.

[11] Patent Number: 5,150,280
[45] Date of Patent: Sep. 22, 1992

[54] ELECTRONIC CIRCUIT PACKAGE

[75] Inventors: Yasunari Arai, Tokyo; Hiroshi Hamano, Kawasaki; Izumi Amemiya, Yokohama; Takuji Yamamoto; Takeshi Ihara, both of Kawasaki, all of Japan

[73] Assignee: Fujitsu Limited, Kawasaki, Japan

[21] Appl. No.: 564,345

[22] Filed: Aug. 8, 1990

[30] Foreign Application Priority Data

| Aug. 11, 1989 | [JP] | Japan | 1-206634 |
| Nov. 28, 1989 | [JP] | Japan | 1-306720 |
| Jan. 17, 1990 | [JP] | Japan | 2-6417 |

[51] Int. Cl.$^5$ .................. H05K 1/18; H01L 23/48
[52] U.S. Cl. .................. 361/401; 361/395; 361/399; 361/404; 361/408; 357/69; 357/70; 385/53
[58] Field of Search ............. 361/399, 401, 404, 408, 361/395; 350/96.2; 385/53; 357/81, 69, 70, 74

[56] References Cited

U.S. PATENT DOCUMENTS

| 4,630,172 | 12/1986 | Stenerson et al. | 361/386 |
| 4,677,528 | 1/1987 | Minict | 361/398 |
| 4,701,781 | 10/1987 | Sanklagewit | 357/70 |
| 4,705,917 | 11/1987 | Gates, Jr. et al. | 174/52 FP |
| 4,732,446 | 3/1988 | Gipson et al. | 350/96.15 |
| 4,998,182 | 3/1991 | Krauter et al. | 361/394 |
| 5,016,085 | 5/1991 | Hubbard et al. | 357/74 |

Primary Examiner—Georgia Y. Epps
Attorney, Agent, or Firm—Staas & Halsey

[57] ABSTRACT

An electronic circuit package which includes first and second conductive metal members and a circuit board held between the first and second metal members and having a cutout in which an electronic circuit part is accommodated and a process of producing such electronic circuit package are disclosed. With the electronic circuit package, deterioration of a high speed characteristic of an electronic circuit part accommodated in the package is minimized, and accordingly, when the electronic circuit package is applied to an IC for very high speed optical communications for use with an optical repeater or the like, a very high speed system can be realized. By assembling the components in accordance with a predetermined order, facility in process of production and improvement in reliability of products are attained.

30 Claims, 14 Drawing Sheets

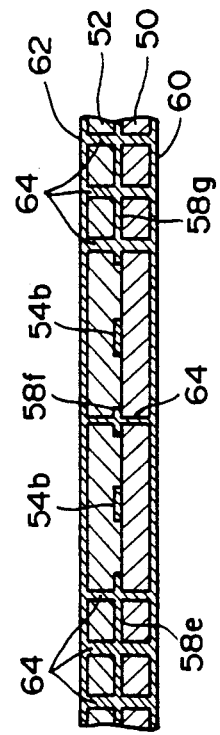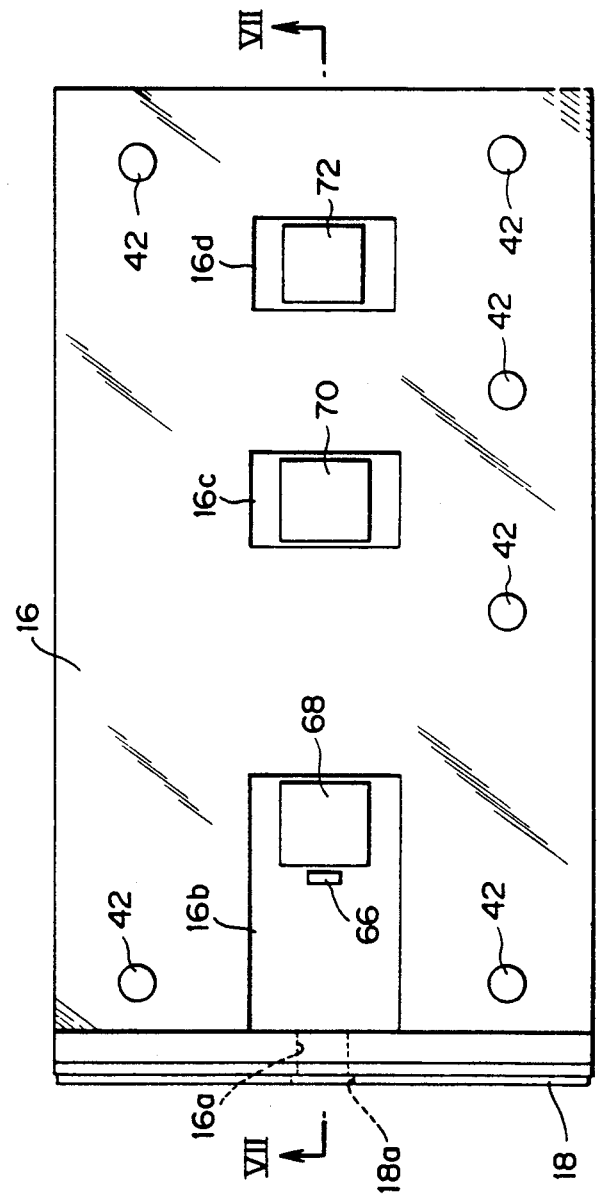

ELECTRONIC CIRCUIT PACKAGE

BACKGROUND OF THE INVENTION

This invention relates to an electronic circuit package and a process of producing the same, and more particularly to an electronic circuit package suitable for use with ICs for very high speed optical communications, which is used in an optical repeater or the like and a process of producing such electronic circuit package.

In recent years, very wide band single mode optical fibers have been put into practical use as optical transmission lines, and the application range of high speed transmission systems is being expanded widely. Nowadays, a 1.6 Gb/s system is introduced into a main line system. Meanwhile, as the service to subscribers is expanded, the tendency of increasing the speed of a transmission system is expanding progressively, and the speed target of a next term system is raised at a stroke to 10 Gb/s in connection with construction of a network based on a new synchronous network. In order to realize a system which deals with electric signals in a so-called microwave region, not only it is necessary to develop optical elements and electronic circuits which can operate in a microwave region, but also it is necessary to develop electronic circuit packages for packaging such elements and electronic circuits without deteriorating high speed characteristics of them.

An exemplary one of known packages for ICs (integrated circuits) in a system having a transmission speed of up to several Gb/s which have been put into practical use in a main line system has a layer structure of an insulating substance wherein a conductor pattern is interposed for each layer and electric connection between different layers is established by way of through-holes formed in the layers. The electronic package, however, cannot sufficiently satisfy such demands as listed below and accordingly cannot be applied readily to a very high speed system having a transmission speed higher than several Gb/s.

(1) Strengthening of Grounding

As the speed of a signal rises, it becomes a technical subject whether or not grounding of an electronic circuit can be assured sufficiently. For example, connection between a ground port of an IC chip and a grounding portion of an external circuit is normally established by means of wire bonding, but in a high frequency region, such bonding wire will act as an inductance, which will make grounding insufficient. Meanwhile, if the external grounding portion itself is produced by drawing of a conductor pattern or the like, then the conductor pattern or the like itself may have an impedance. Where grounding is not sufficient, a common potential with respect to input signals from the outside will not be present, which will have such a significant bad influence that crosstalk or noises are increased or an input reflection characteristic is deteriorated. Further, a circuit construction of a differential couple such as an ECL (Emitter Coupled Logic) or an SCFL (Source Coupled Logic) which is used principally as a high speed circuit is essentially tough against a variation of a power source, but is weak for a variation of a ground potential, and a stable operation cannot be assured. Accordingly, it is demanded to strengthen grounding to restrain deterioration of a high speed characteristic.

(2) Decrease of External Junctions of High Speed Signals

As the speed of a signal rises, the difficulty in interface between IC chips increases, and in order to assure required characteristics, it is necessary to establish connection between chips by way of a transmission line which requires impedance matching. A matched impedance is suitable at 50 Ω for the facility in measurement. Meanwhile, as the speed of a signal rises, the difficulty in drawing of a transmission line increases, and besides a high speed characteristic may be deteriorated significantly depending upon a condition of wire bonding, soldering and so forth. Accordingly, it is desirable to decrease treatment of high speed signals outside an IC chip as little as possible. Consequently, it is demanded to decrease interface points to high speed signals outside an IC chip or outside a package as little as possible to restrain deterioration of a high speed characteristic.

(3) Matching of High Speed Signal Lines

As described above, a high speed signal should be transmitted over an impedance line of 50 Ω. In this instance, it is demanded for the impedance line and terminal conditions to assure matching over an entire applicable frequency range. For example, although it may overlap with the demand of (1) above, if grounding of a ground pattern extending in parallel to a signal strip line on a circuit board is not perfect even in a high frequency, the strip line will not exhibit required characteristics as a transmission line and will be deteriorated in input reflection characteristic. Accordingly, it is demanded to assure matching of high speed signal lines to restrain deterioration of a high speed characteristic.

(4) Prevention of Crosstalk

There is the possibility that a high speed characteristic may be deteriorated or oscillation may be caused by crosstalk between an input and an output of an IC chip or crosstalk between chips in the case of multichip packaging. Particularly in the field of optical communications, countermeasures to crosstalk are important for the object of improvement in function, increase in gain and promotion in high integration of an IC chip and increase in scale and aggregation in function of a package. Further, in the case of a circuit board having a large size, the circuit board itself may act as a cavity resonator, or in the case of a cavity in which an IC chip is accommodated, the spacing itself of the cavity may act as a cavity resonator, which will remarkably deteriorate a crosstalk characteristic at its resonance frequencies. Therefore, it is also necessary to take measures against such deterioration in crosstalk characteristic. Accordingly, it is demanded to prevent crosstalk to restrain deterioration of a high speed characteristic.

(5) Countermeasures for Heat Radiation

By the way, if the integration of an IC chip is improved or the speed of an electronic circuit is raised in form or else a terminal resistor is built in an IC chip, then the power consumption of an IC chip will be increased, that is, the amount of heat generation will be increased. Meanwhile, where an IC chip is of the silicon type, the substrate thereof cannot always be held at a ground potential because it is necessary to keep the rear face side (substrate) of the IC chip at a lowest potential. Accordingly, in such an instance, the IC chip cannot be securely mounted directly on a grounding portion, and countermeasures for heat radiation are particularly important. Accordingly, it is demanded to take measures for both heat radiation and restraint of a high speed characteristic deterioration.

SUMMARY OF THE INVENTION

It is an object of the present invention to provide an electronic circuit package wherein grounding is strengthened to restrain deterioration of a high speed characteristic of the package and a process of producing such electronic circuit package.

It is another object of the present invention to provide an electronic circuit package wherein external junctions of high speed signals are decreased to restrain deterioration of a high speed characteristic of the package and a process of producing such electronic circuit package.

It is a further object of the present invention to provide an electronic circuit package wherein matching of high speed signal lines is assured to restrain deterioration of a high speed characteristic of the package and a process of producing such electronic circuit package.

It is a still further object of the present invention to provide an electronic circuit package wherein crosstalk is prevented effectively to restrain deterioration of a high speed characteristic of the package and a process of producing such electronic circuit package. p It is an additional object of the present invention to provide an electronic circuit package wherein measures for both heat radiation and restraint of a high speed characteristics deterioration of the package are taken effectively and a process of producing such electronic circuit package.

According to an aspect of the present invention, there is provided an electronic circuit package which comprises first and second conductive metal members, and a circuit board disposed between the first and second metal members and having a cutout in which an electronic circuit part is accommodated. Here, a cutout is, where it is formed at an edge portion of the circuit board, in the form of a notch, but where it is formed at any other portion of the circuit board than an edge portion, for example, at a mid portion, it is in the form of an opening.

Preferably, the circuit board includes a first insulator layer having conductor patterns formed on a surface thereof, and a second insulator layer held in close contact with the first insulator layer in such a manner as to cover over the conductor patterns except edge portions of an outer periphery of the circuit board and edge portions of the cutout. According to the construction, the conductor patterns can be formed on the same plane, and when, for example, signal strip lines are to be formed, connection between a plurality of conductor patterns by way of via-contacts or through-holes is unnecessary. Accordingly, mismatching in impedance of high speed signal lines caused by these via-contacts or through-holes does not take place readily. Further, since the conductor patterns can be exposed on the first insulator layer at the edge portions of the outer periphery of the circuit board and the edge portions of the cutout, connection can be made at the exposed portions of the conductor patterns to the electronic circuit part or package leads.

Preferably, the conductor patterns on the edge portions of the cutout are connected to the electronic circuit part accommodated in the cutout, and the conductor patterns on the edge portions of the outer periphery of the circuit board are connected to package leads. This facilitates connection between the electronic circuit part and an external circuit.

Where the circuit board has a plurality of such cutouts, a plurality of electronic parts can be individually accommodated in the inside of the cutouts independently of each other. Consequently, mutual interference between the electronic circuit parts is restrained and a crosstalk characteristic can be improved comparing with an alternative arrangement wherein a plurality electronic circuit parts are accommodated in the inside of a common cutout. Further, since a plurality of electronic circuit parts can be accommodated in a common package, such an apparatus which has a reduced number of external junctions for high speed signals, that is, an apparatus which interfaces with the outside by way of only low speed signals without outputting high speed signals to the outside, can be provided readily. Where the circuit board has a plurality of cutouts, preferably the first metal member has openings at locations corresponding to the cutouts of the circuit board, and the second metal member has spaces provided at locations corresponding to the cutouts, to which such electronic circuit parts are to be secured.

Preferably, the conductor patterns include signal strip lines having end portions exposed on a pair of opposing edge portions of each of the cutouts, DC or low speed lines having end portions exposed on edge portions of each of the cutouts opposing to the edge portions of the outer periphery of the circuit board, and ground patterns formed in areas other than areas in which the signal strip lines and DC or low speed lines are formed such that the ground patterns do not contact with any of the signal strip lines and DC or low speed lines. According to the construction, when the cutouts are arranged, for example, in a row, the signal strip lines are disposed in one direction from the output side toward the output side of the package, and besides crossing and confusion of signals in the layout of signal strip lines are prevented. Consequently, crosstalk characteristics are improved.

Preferably, each of the electronic circuit parts is an IC chip, and portions of the signal strip lines on the edge portions of the cutouts are connected to high speed signal input/output ports of the IC chips while portions of the DC or low speed lines on the edge portions of the cutouts are connected to low speed signal input/output ports and power supply ports of the IC chips. And portions of the signal strip lines and/or DC or low speed lines on the edge portions of the outer periphery of the circuit board are connected to package leads. Where such connection is provided, the signal strip lines can be formed with minimum distances, and consequently, impedance matching of the signal strip lines can be achieved readily.

Preferably, a metal block is interposed between each of the IC chips and an edge portion of a corresponding one of the cutouts on which the edge portions of the DC or low speed lines are exposed and is secured to the second metal member, and a ground port of a corresponding one of the IC chips is connected to the metal block. According to the construction, connection using a large number of bonding wires corresponding to the size of the metal block can be achieved, and besides the IC chips can be grounded directly to the metal blocks and the second metal members. Accordingly, strong grounding can be attained comparing with an alternative case wherein an IC chip is grounded to a ground pattern on a circuit board. Here, the reason why the metal blocks are interposed not between the IC chips and the edge portions of the cutouts at which the signal strip lines are exposed but between the IC chips and the edge portions of the cutouts at which the DC or low speed lines are exposed is that, while there is the possibility in the former case that bonding wires for interconnecting the signal strip lines and the high speed signal input/output ports of the IC chips may be increased in length so that a high speed characteristic may be deteriorated, there is no possibility in the latter case that a high speed characteristic may be deteriorated even if bonding wires for interconnecting the DC or low speed lines and the low speed signal input/output ports and power supply ports of the IC chips are increased in length.

Preferably, a large number of via-contacts extending through the first and second insulator layers to establish connection with the first and second metal members are provided at least in areas of the ground patterns in the neighborhood of the signal strip lines. According to the construction, radiation of radio waves from the signal strip lines by a high speed signal is restrained, and a crosstalk characteristic is improved.

Where such via-contacts are provided in entire areas of the ground patterns, crosstalk between the input/output ports of the IC chips arising from resonance of the circuit board can be prevented. In particular, while a circuit board on which several IC chips are carried sometimes acts as a cavity resonator having resonance points in a practical frequency region in dimension, provision of a large number of via-contacts in the entire areas of the ground patterns will be equivalent to division of the circuit board into small fractions and will shift resonance frequencies to a region higher than practical frequencies. Consequently, deterioration of a crosstalk characteristic which may arise from resonance is prevented. Further, since the large number of via-contacts are connected with the first and second metal members, the ground potential of them can be stabilized.

Preferably, ground patterns with which the via-contacts connect are also formed on the opposite faces of the first and second insulator layers to the conductor patterns, and the connection between the via-contacts and the first and second metal members is provided by close contact between the ground patterns and the first and second metal members. In this instance, where a ground port provided on each of the IC chips in such a manner as to surround the high speed signal input/output port is connected to a corresponding one of the ground patterns by way of a plurality of bonding wires, space crosstalk between the inputs and outputs of the IC chips can be restrained.

Preferably, the IC chips are secured to the second metal member each by way of a receiving table of a predetermined thickness such that the high speed signal input/output ports and signal strip lines are positioned substantially on the same plane. The receiving tables may be integral with the second metal member or separate members from the second metal member.

According to another aspect of the present invention, there is provided a process of producing an electronic circuit package, which comprises a first step of applying, to the opposite faces of a circuit board having a cutout in which an IC chip is to be accommodated, a first metal member having an opening at a location thereof corresponding to the cutout and a second metal member having a space to which the IC chip is to be secured, a second step of securing the IC chip and a metal block to which a ground port of the IC chip is to be connected to the second metal member in the cutout, a third step of connecting the IC chip to the circuit board and metal block by means of wire bonding, and a fourth step of covering over the opening of the first metal member with a lid member made of a metal, the first to fourth steps being proceeded in this order. Preferably, the application of the first and second metal members and the circuit board at the first step is achieved by brazing.

Preferably, the first and second metal members are made of copper tungsten while the circuit board is made principally of ceramics. Since copper tungsten is high in coefficient of thermal conductivity, the heat radiating property is improved. Further, since the coefficient of linear thermal expansion of copper tungsten can be adjusted by adjusting the ratio in composition between copper and tungsten, the coefficients of linear thermal expansion of the first and second metal members can be adjusted in accordance with a coefficient of linear thermal expansion of the IC chips or circuit board.

The above and other objects, features and advantages of the present invention and the manner of realizing them will become more apparent, and the invention itself will best be understood, from a study of the following description and appended claims, with reference had to the attached drawings showing some preferred embodiments of the invention.

BRIEF DESCRIPTION OF THE DRAWINGS

FIG. 5 is a partial sectional view of the circuit board near a signal strip line;

FIG. 6 is a plan view showing a receiving table for an IC chip and so forth secured to a second metal member;

DESCRIPTION OF THE PREFERRED EMBODIMENTS

In the following, best forms of the present invention will be described in detail with reference to the drawings.

Figure 1:
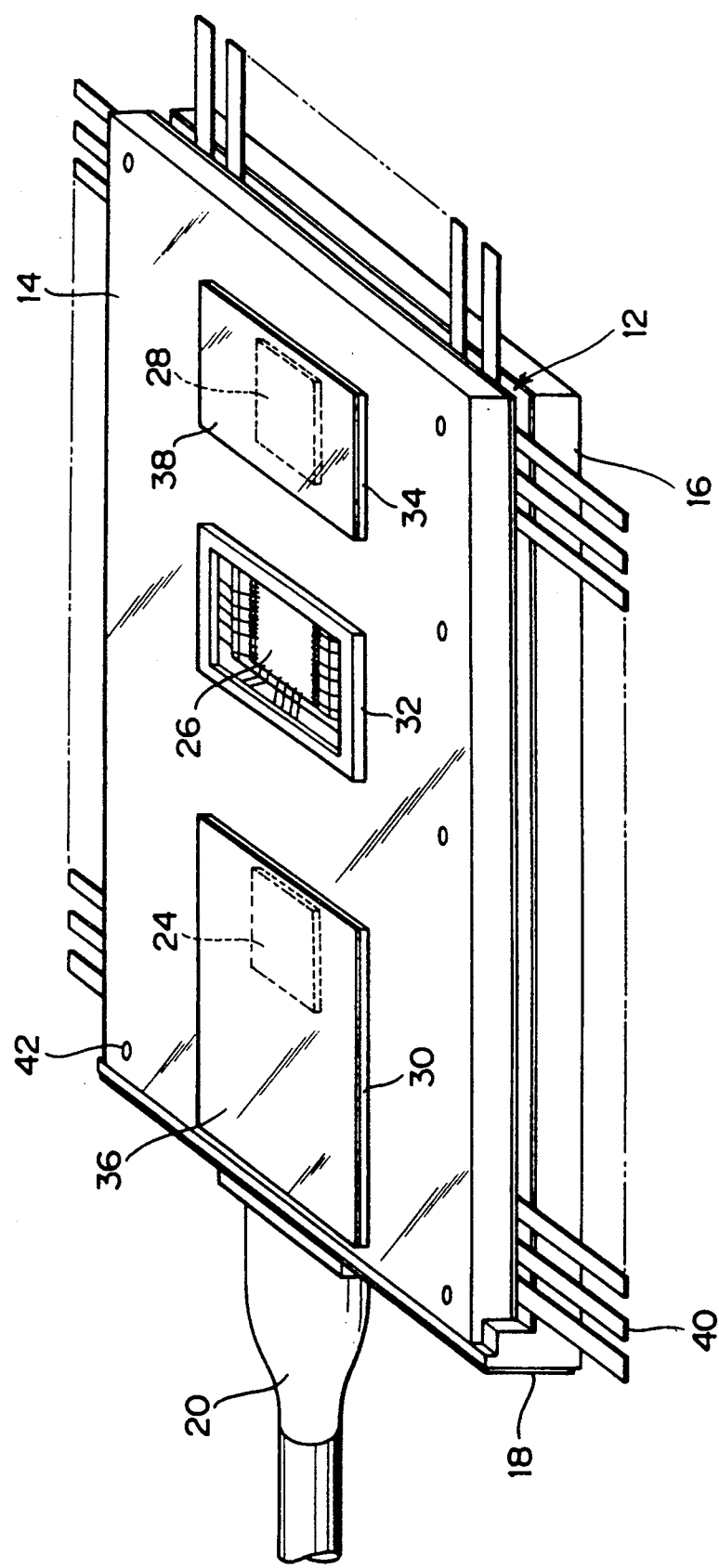
FIG. 1 is a perspective view of an electronic circuit package applied to an apparatus for an optical repeater showing an embodiment of the present invention.

FIG. 1 is a perspective view of an electronic circuit package applied to an apparatus for an optical repeater showing an embodiment of the present invention. The apparatus operates to convert a high speed optical signal transmitted by way of an optical fiber into an electric signal, demultiplex the electric signal and output the demultiplexed electric signal therefrom. Here, demultiplexing signifies that an electric signal is separated (for example, time divided) into a plurality of signals of comparatively low speeds which can be easily treated.

Figure 2:
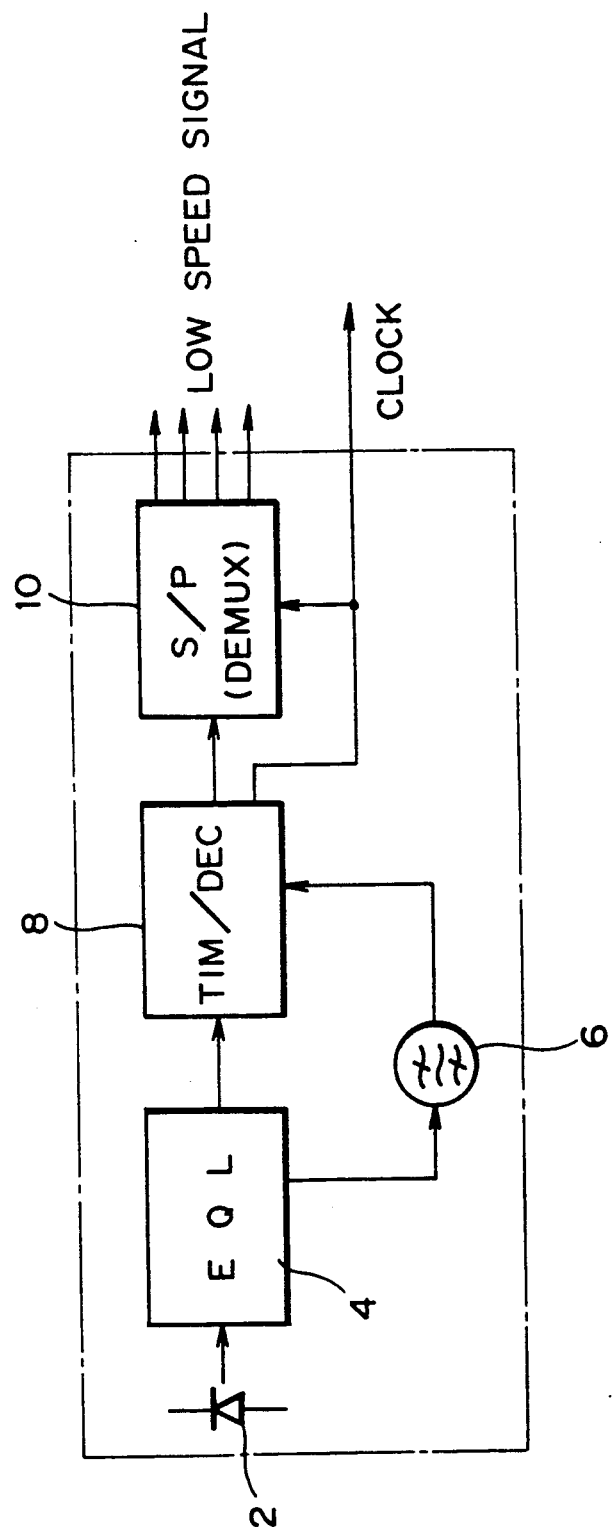
FIG. 2 is a functional block diagram of the apparatus shown in FIG. 1.

In particular, the apparatus includes, as even in a functional block diagram of FIG. 2, a photoelectric transducer element 2 such as an APD (avalanche photodiode) for converting an optical signal into an electric signal, an EQL circuit (equalizing amplifier circuit) 4 for amplifying the electric signal obtained by such conversion, a filter circuit 6 for extracting clocks from an output signal of the EQL circuit 4, a TIM/DEC circuit (timing/decision circuit) 8 for effecting timing/decision in response to the clocks thus extracted, and an S/P circuit (serial/parallel converter circuit) 10 for demultiplexing a high speed signal from the TIM/DEC circuit 8 into a plurality of comparatively low speed signals.

Referring back to FIG. 1, reference numeral 12 denotes a circuit board having cutouts in each of which an IC chip is to be accommodated. Reference numeral 14 denotes a first metal member made of CuW and having openings formed therein corresponding to the cutouts of the circuit board 12. The first metal member 14 is securely mounted on an upper face of the circuit board 12. Reference numeral 16 denotes a second metal member made of CuW and having spaces to each of which an IC chip is to be secured. The second metal member 16 is securely mounted on a lower face of the circuit board 12. A side plate 18 made of kovar which permits welding is joined to a side face of the second metal member 16. Reference numeral 20 denotes a pipe member made of kovar for introducing an optical fiber into the inside of the package. The pipe member 20 is secured to a predetermined location of the side plate 18, for example, by means of laser welding. Accommodated in the cutouts formed in the circuit board 12 are, in the case of the present embodiment, an IC chip 24 for an EQL circuit, another IC chip 26 for a TIM/DEC circuit, and a further IC chip 28 for an S/P circuit. Frame members 30, 32 and 34 are securely mounted along edges of the openings formed at locations of the first metal member 14 corresponding to the IC chips 24, 26 and 28, respectively. Reference numerals 36 and 38 denote lid members for the enclosure made of kovar and welded to the frame members 30 and 34, respectively (a further lid member is provided for the IC chip 26 but is not shown). Reference numeral 40 denotes a package lead provided at an edge portion of an outer periphery of the circuit board 12, and 42 a hole for securing the package to a frame or the like.

Figure 3:
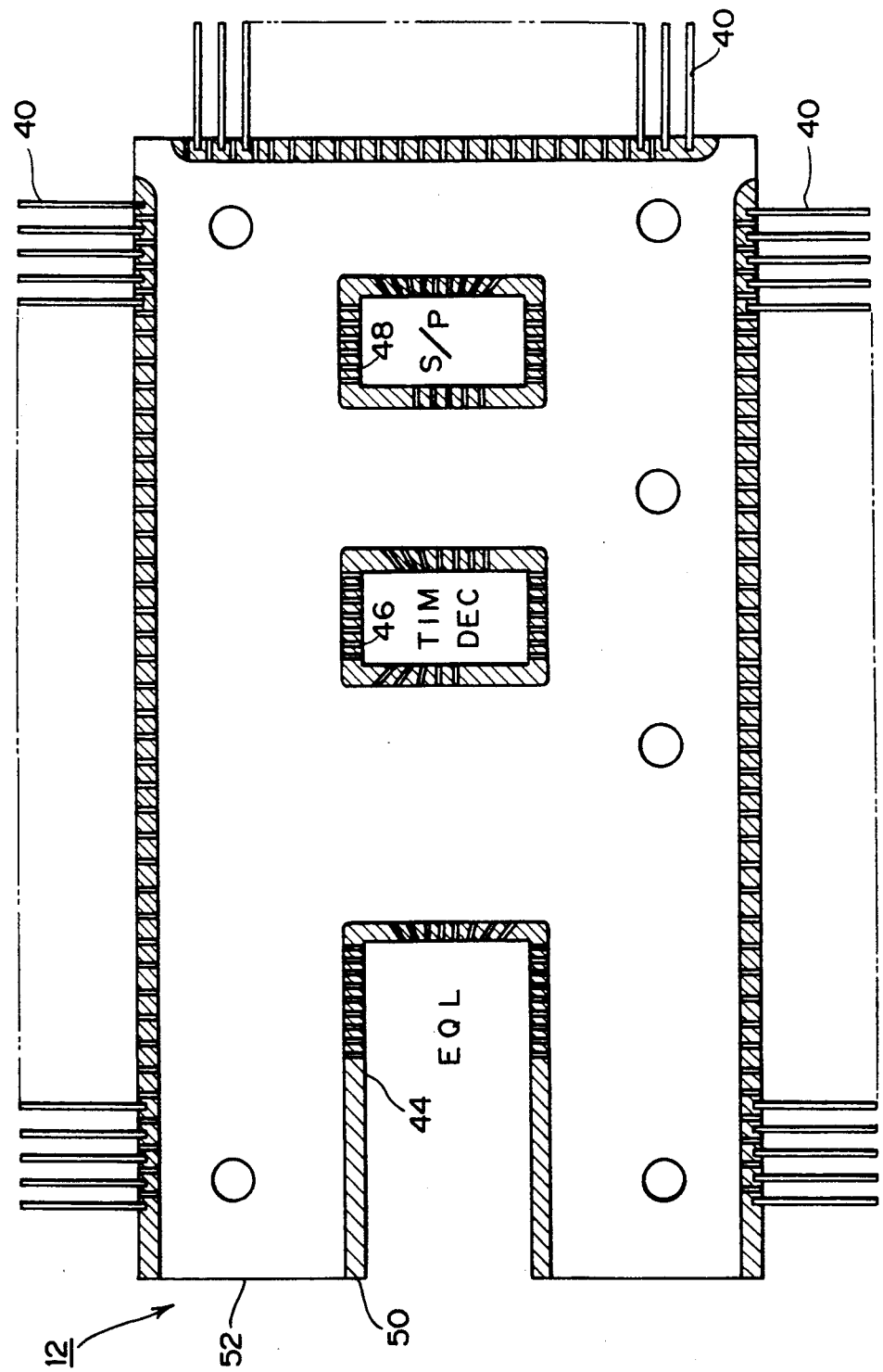
FIG. 3 is a plan view of a circuit board.

FIG. 3 is a plan view of the circuit board 12. Reference numeral 44 denotes a cutout in which the IC chip 24 for an EQL circuit is to be accommodated, 46 another cutout in which the IC chip 26 for a TIM/DEC circuit is to be accommodated, and 48 a further cutout in which the IC chip 28 for an S/P circuit is to be accommodated. Reference numeral 50 denotes a first insulator layer made of a ceramics material and having formed on a surface thereof conductor patterns which are indicated by shadow marks, and 52 a second insulator layer made of a ceramics material and adhered to the first insulator layer 50 such that it may cover over the conductor patterns except edge portions of an outer periphery of the circuit board and edge portions of the individual cutouts. With the construction of the circuit board, the package leads 40 can be connected in accordance with the necessity to portions at the edge portions of the outer periphery of the first insulator layer 50 at which the conductor patterns are exposed, and the individual IC chips can be connected to the conductor patterns exposed at the edge portions of the cutouts of the first insulator layer 50 using, for example, bonding wires.

Figure 4:
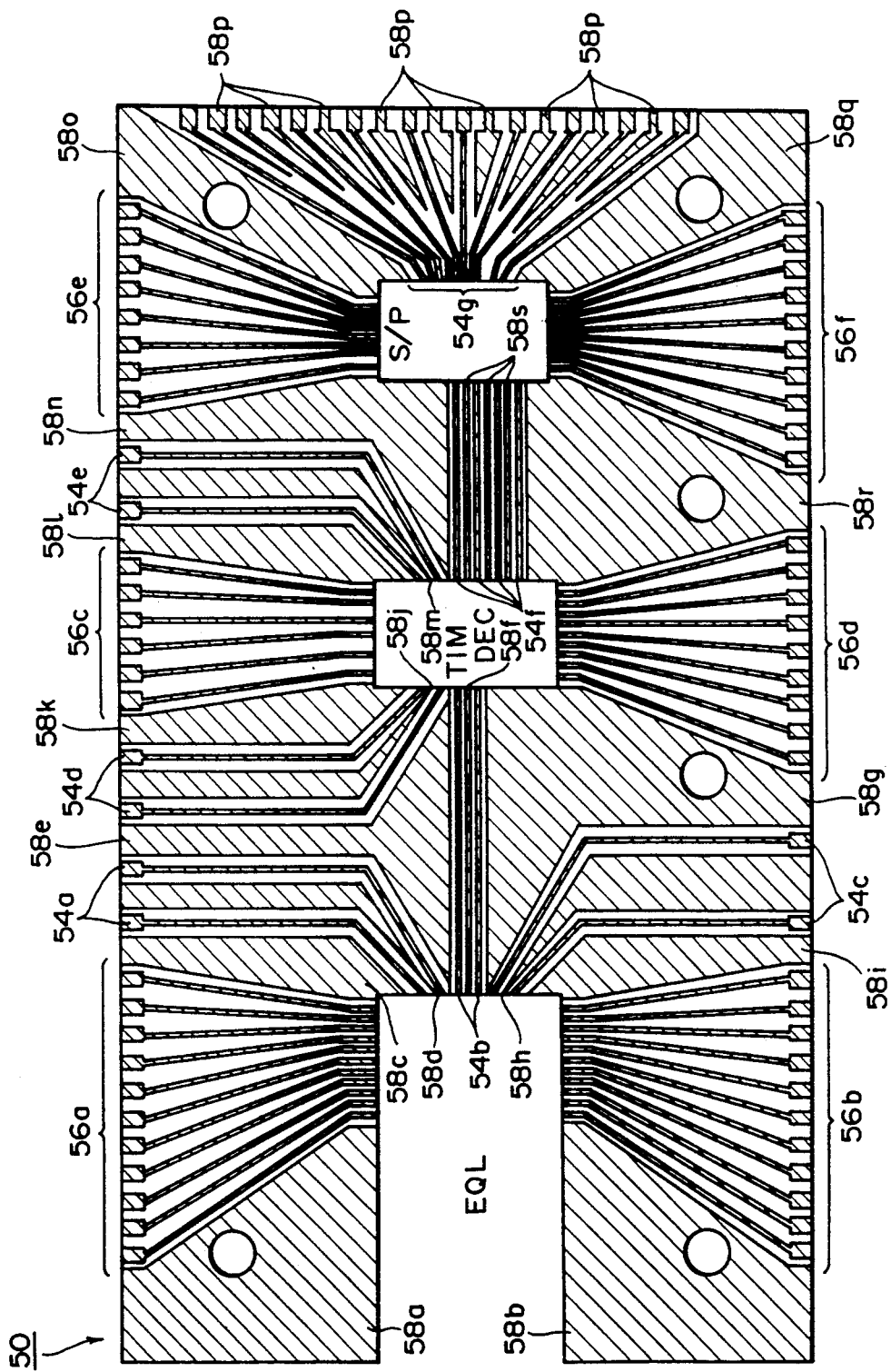
FIG. 4 is a plan view of a first insulator layer of the circuit board.

FIG. 4 is a plan view of the first insulator layer 50 of the circuit board. The conductor patterns formed on the first insulator layer 50 include signal strip lines 54 (54a to 54g) having end portions exposed at edge portions of the cutouts opposing to each other, DC or low speed lines 56 (56a to 56f) having end portions exposed on edge portions of the cutouts opposing to the edge portions of the outer periphery of the circuit board, and ground patterns 58 (58a to 58s) provided in areas other than the areas in which the signal strip lines 4 and DC or low speed lines 56 are formed such that they may not contact with any of the signal strip lines 54 and DC or low speed lines 56. Among the signal strip lines 54, the signal strip lines 54a, 54b and 54c are provided for transmitting an output of the IC chip 24 for an EQL circuit to the filter circuit, the IC circuit 26 for a TIM/DEC circuit and the monitor output, respectively; the signal strip lines 54d are provided for transmitting clocks from the filter circuit to the IC chip 26 for a TIM/DEC circuit; the signal strip lines 54e are provided for transmitting clocks from the IC chip 26 for a TIM/DEC circuit to an external circuit; the signal strip lines 54f are provided for transmitting an output of the IC chip 26 for a TIM/DEC circuit to the IC chip 28 for an S/P circuit; and the signal strip lines 54g are provided for transmitting a signal obtained by S/P conversion, that is demultiplexing, to an external circuit. Among the DC or low speed lines 56, the DC or low speed lines 56a and 56b are provided for connecting input/output ports for low speed signals such as a control signal and power supply ports of the IC chip 24 for an EQL circuit to an external circuit; the DC or low speed lines 56c and 56d are provided for connecting low speed signal input/output ports and power supply ports of the IC chip 26 for a TIM/DEC circuit to an external circuit; and the DC or low speed lines 56e and 56f are provided for connecting low speed signal input/output ports and power supply ports of the IC chip 28 for an S/P circuit to an external circuit. Among the ground patterns 58, the ground patterns 58a and 58b are provided adjacent the DC or low speed lines 56a and 56b, respectively; the ground pattern 58c is provided between the DC or low speed lines 56a and the signal strip lines 54a; the ground pattern 58d is provided between the signal strip lines 54a; the ground pattern 58e is provided among the signal strip lines 54a, 54b and 54d; the ground pattern 58f is provided between the signal strip lines 54b; the ground pattern 58g is provided among the DC or low speed lines 56d and signal strip lines 54b and 54c; the ground pattern 58h is provided between the signal strip lines 54c; the ground pattern 58i is provided between the signal strip lines 54c and DC or low speed lines 56b; the ground pattern 58j is provided between the signal strip lines 54d; the ground pattern 58k is provided between the signal strip lines 54d and DC or low speed lines 56c; the ground pattern 58l is provided between the DC or low speed lines 56c and signal strip lines 54e; the ground pattern 58m is provided between the signal strip lines 54e; the ground pattern 58n is provided among the signal strip lines 54e and 54f and DC or low speed lines 56e; the ground pattern 58o is provided between the DC or low speed lines 56e and signal strip lines 54g; the ground patterns 58p are provided each between adjacent ones of the signal strip lines 54g; the ground pattern 58q is provided between the signal strip lines 54g and DC or low speed lines 56f; the ground pattern 58r is provided among the DC or low speed lines 56f and 56d and signal strip lines 54f; and the ground patterns 58s are provided each between adjacent ones of the signal strip lines 54f.

FIG. 5 is a partial sectional view of the circuit board 12 near the signal strip lines 54b. The ground patterns 58e and 58g are provided on the opposite sides of the signal strip lines 54b while the ground pattern 58f is provided between the signal strip lines 54b, and those conductor patterns disposed on the same plane are held between the first insulator layer 50 and second insulator layer 52. Reference numerals 60 and 62 denote ground patterns formed, though not shown in FIG. 3, on a lower face of the first insulator layer 50 and an upper face of the second insulator layer 52, respectively. Then, a large number of via-contacts 64 are formed on entire faces of the ground patterns 58e and 58g and extend through the first and second insulator layers 50 and 52 so that they are connected with the ground patterns 60 and 62. According to the construction, when the circuit board is stuck together with the first and second metal members 14 and 16, the first and second metal members 14 and 16 and the individual ground patterns can be stabilized to the same potential (ground potential) thereby to assure good transmission characteristics of the signal strip lines and resonance frequencies of the circuit board can be raised to an ignorable level thereby to improve a crosstalk characteristic.

Figure 7:
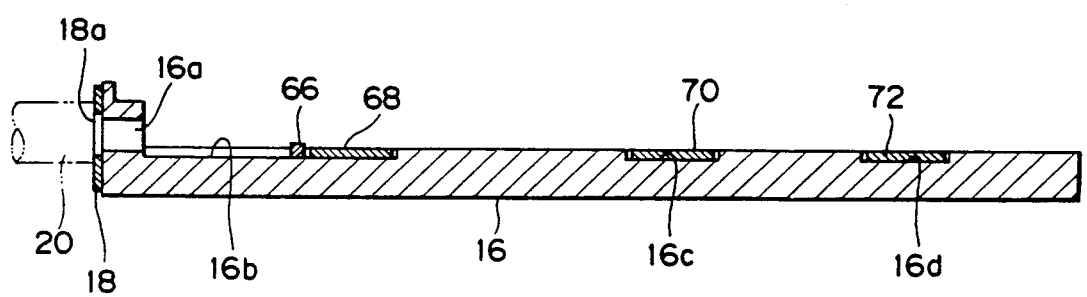
FIG. 7 is a sectional view taken along line VII—VII of FIG. 6.

FIG. 6 is a plan view showing a receiving table for an IC chip and so forth secured to the second metal member 16, and FIG. 7 is a sectional view taken along line VII—VII of FIG. 6. Reference characters 18a and 16a denote fiber-introducing holes formed in the side plate 18 and second metal member 16, respectively. An optical fiber from the fiber pipe 20 secured to the side plate 18 is introduced into the inside of the package by way of the introducing holes 18a and 16a. Depressions 16b, 16c and 16d are formed in this order from the fiber introducing side at locations on the upper face of the second metal member 16 corresponding to the cutouts of the circuit board. Reference numeral 66 denotes a chip carrier made of CuW and secured in the depression 16b. A photoelectric transducer element which will be hereinafter described is secured to the chip carrier 66 indirectly by way of a wiring board with a light receiving face thereof directed upwardly. Reference numerals 68, 70 and 72 denote receiving tables made of an insulating substance having a high thermal conductivity such as AlN (aluminum nitride) and secured in the depressions 16b, 16c and 16d, respectively, of the second metal member. The IC chips 24, 26 and 28 are secured to the receiving tables 68, 70 and 72, respectively.

Figure 8A:
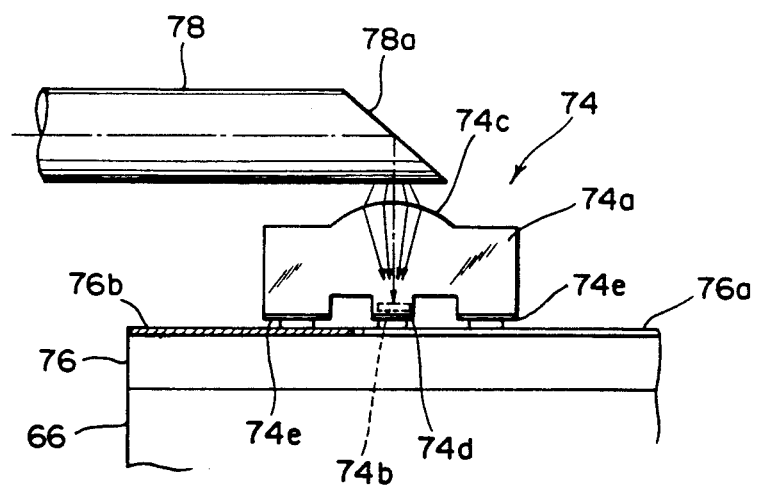
FIG. 8A is a partial sectional side elevational view showing an example of construction of an optical coupling portion.

FIG. 8A is a partial sectional side elevational view showing an example of construction of an optical coupling portion between an optical fiber and a photoelectric transducer element. A photoelectric transducer element 74 includes an element body 74a made of a compound semiconductor or the like, a light receiving portion 74b formed at a lower portion of the element body 74a, a lens portion 74c formed at an upper portion of the element body 74a, and a signal terminal 74d and a bias terminal 74e for extracting photoelectric current generated in the light receiving portion 74b. The lens portion 74c is formed by process control upon production of the element body 74a. The signal terminal 74d and bias terminal 74e are connected, for example, by means of flip chip bonding to a signal line 76a and a bias pattern 76b, respectively, on a wiring board 76 secured to the chip carrier 66. Light having propagated in an optical fiber 78 is totally reflected by a slant-end face 78a polished obliquely with respect to a plane perpendicular to a geometrical center axis of the optical fiber 78 so that it emerges from a side face of the optical fiber 78. The light is then converged by a lens function of the lens portion 74c of the photoelectric transducer element 74 and is introduced in a high efficiency into the light receiving portion 74b. According to the construction and action described above, since the geometrical center axis of the optical fiber 78, the light receiving face and the signal line 76a can be disposed in parallel to each other, reduction in thickness of an optical coupling portion can be achieved and assurance of a high speed characteristic can be achieved through reduction of the capacitance of the photoelectric transducer element 74.

Figure 8B:
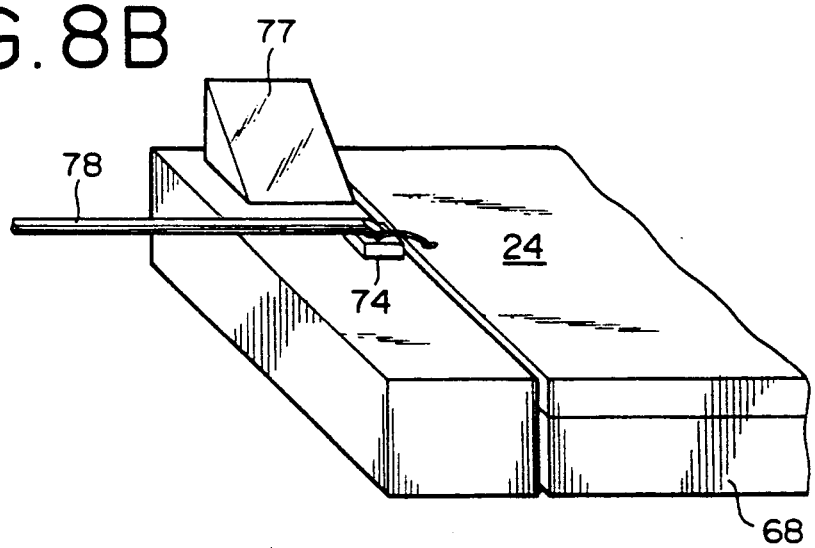
FIGS. 8B and 8C are perspective views showing examples of a disposition of a mirror or a prism.
Figure 8C:
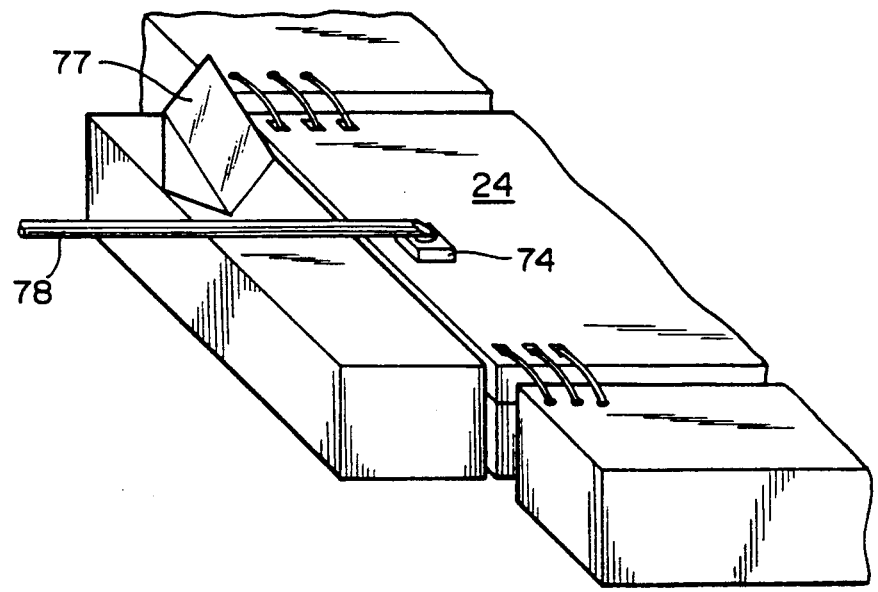

FIG. 8B and FIG. 8C are perspective views showing examples of a disposition of a mirror or a prism 77, a photoelectric transducer element 74, and a fiber 78 inside of the cutout. According to this disposition, the distance between the surface of the photoelectric transducer element 74 and the fiber end by way of the reflection of the mirror or the prism 77. This inspection enables easy adjustment of the fiber-end position to the photoelectric transducer element.

Figure 9:
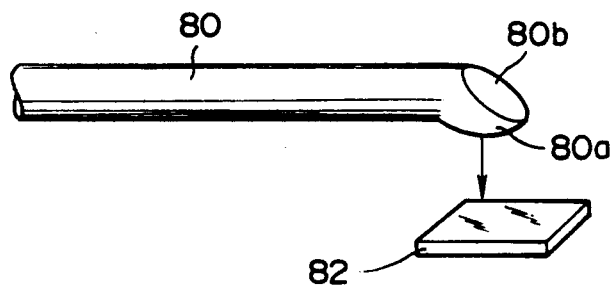
FIG. 9 is a perspective view showing another example of construction of an optical coupling portion.

It should be noted that it is not so easy to have an inspection window at the side of the electronic circuit package in the present invention to look inside the cutout from the view point horizontal to the cutout, FIG. 9 is a perspective view showing another example of construction of an optical coupling portion. In the present example, a spherical portion 80a is formed at an end portion of an optical fiber 80, and an obliquely polished end face 80b is formed on the spherical portion 80a in such a form that the spherical portion 80a is cut obliquely. Thus, totally reflected light at the end face 80b is converged by a lens function of the spherical portion 80a so that it may be introduced into a light receiving portion of a photoelectric transducer element 82 which has no lens portion thereon. Also with the present example, reduction in thickness of an optical coupling portion and assurance of a high speed characteristic can be achieved similarly as in the example of construction shown in FIG. 8. Further, according to the present construction, since a laterally emerging beam from an optical fiber is a converging beam, the tolerance in displacement of the optical fiber is increased.

Figure 10:
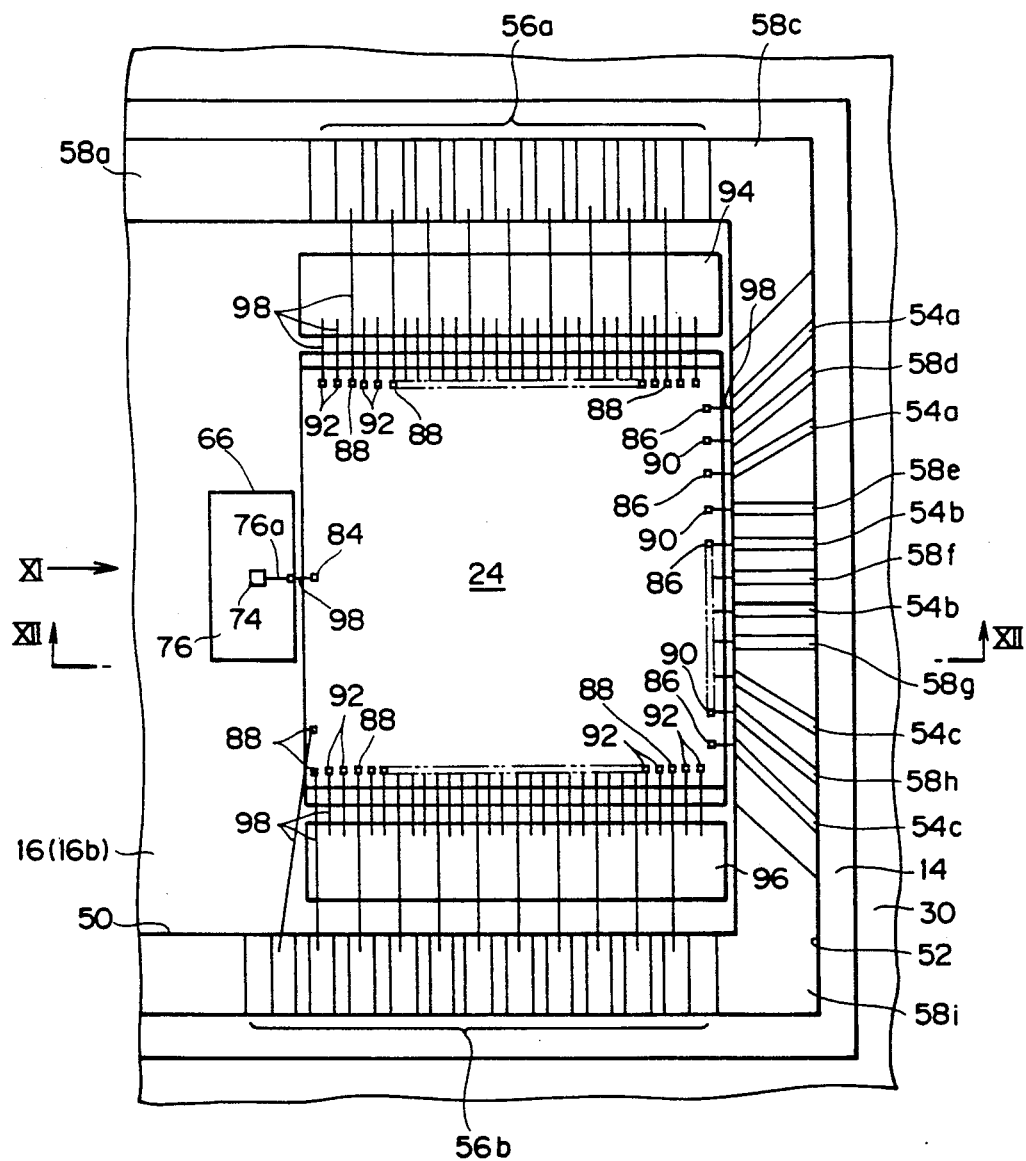
FIG. 10 is a broken plan view showing an example of an accommodating portion for an IC chip.
Figure 11:
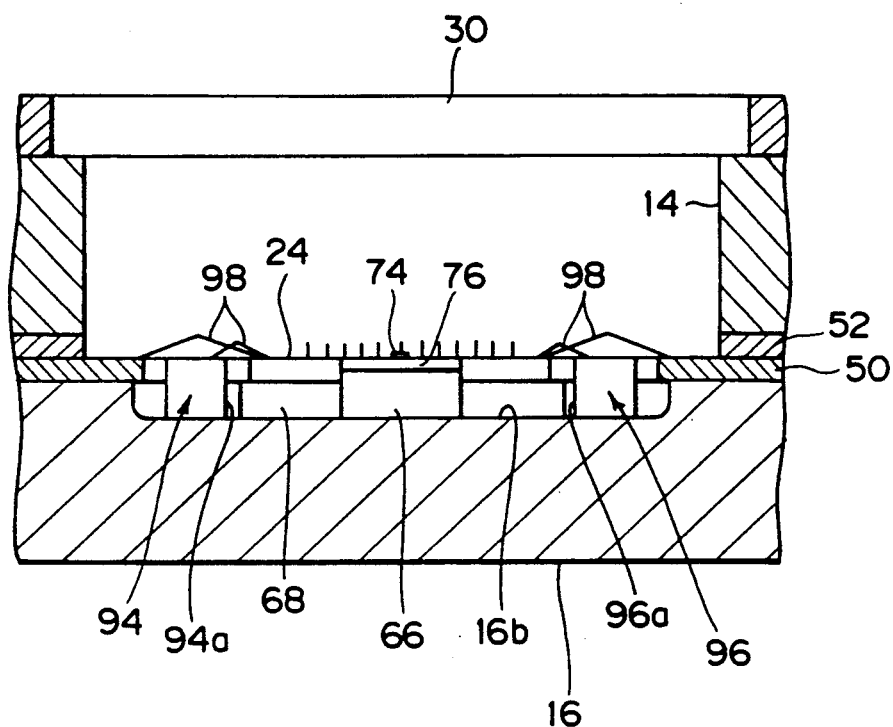
FIG. 11 is a view as viewed in the direction indicated by an arrow mark XI in FIG. 10.
Figure 12:
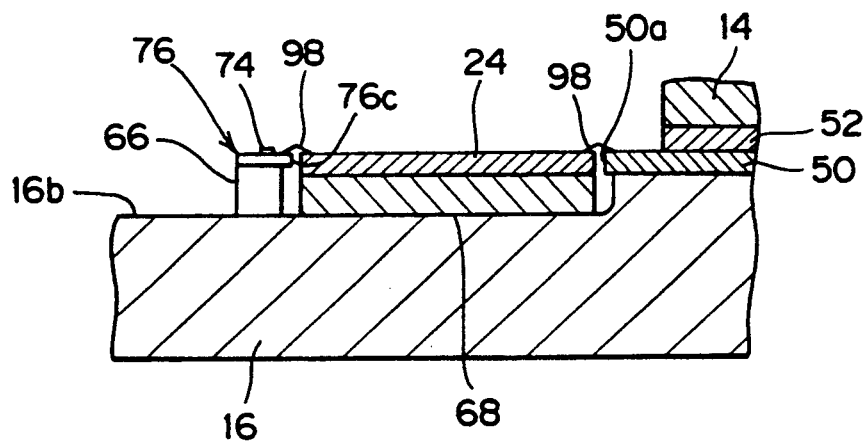
FIG. 12 is an end view along a section taken along line XII—XII of FIG. 10.

FIGS. 10 to 12 are views showing a concrete example of an accommodating portion for an IC chip, and FIG. 10 is a broken plan view showing an accommodating portion for an IC chip 24 for an EQL circuit, FIG. 11 is a view as viewed in the direction indicated by an arrow mark XI in FIG. 10, and FIG. 12 is an end view along a section taken along line XII—XII in FIG. 10. The IC chip 24 for an EQL circuit has an upper face, for example, of a 5 mm square, and a high speed signal input port 84 by way of which a photoelectric conversion signal is to be inputted and a plurality of high speed signal output ports 86 by way of which amplified signals are to be outputted are provided on a pair of opposing edge portions of the upper face of the IC chip 24 for an EQL circuit. Meanwhile, a large number of power supply ports and input/output ports 88 for control signals are provided on the other pair of opposing edge portions of the upper face of the IC chip 24. Further, ground ports 90 and 92 are provided respectively between and adjacent the ports 86 and between and adjacent the ports 88, respectively. Reference numerals 94 and 96 denote metal blocks made of CuW and adapted to be accommodated in the cutout 44 together with the IC chip 24. The metal blocks 94 and 96 are secured in the depression 16b of the second metal member 16 adjacent the opposing edge portions of the upper face of the IC chip 24 at which the ports 88 are provided. Thus, the metal blocks 94 and 96 are interposed between the IC chip 24 and the edge portions of the cutout at which DC or low speed lines 56a and 56b are exposed. Then, the port 84 and the signal line 76a from the photoelectric transducer element, the ports 86 and the signal strip lines 54a, 54b and 54c, the ports 88 and the DC or low speed lines 56a and 56b, the ports 90 and the ground patterns 58d, 58e, 58f, 58g and 58h, and the ports 92 and the metal blocks 94 and 96, are electrically connected to each other each by way of a bonding wire 98.

In the present example, in order to minimize the lengths at least of bonding wires for a high speed signal and for the grounding, the thicknesses of the IC chip 24, the receiving table 68 for the IC chip 24 and the first insulator layer 50 of the circuit board and the depth of the depression 16b of the first metal member are optimized and the various components are arranged such that the various ports of the IC chip 24, conductor patterns of the circuit board 12 and upper faces of the metal blocks 94 and 96 may be positioned substantially on the same plane. Since the gaps from side faces of the IC chip 24 to an end face 76c of the wiring board 76 and to side faces 94a and 96a of the metal blocks 94 and 96 are, for example, 0.3 mm or so and are thus very small as seen in FIGS. 11 and 12, the lengths of bonding wires in the gaps can be set to about 0.5 mm, and consequently, a high speed characteristic can be improved and grounding can be strengthened. Further, since the ground ports 92 are directly connected at a plurality of locations to the metal blocks 94 and 96, the ground potential of the IC chip is stabilized.

By the way, since the IC chip 24 in the present example is accommodated in a small space, when the IC chip 24 is secured to the receiving table 68 using, for example, an AuSn eutectic crystal material, scrubbing in the leftward and rightward directions in FIG. 10 or 12 cannot be performed. However, since in the present example the metal blocks 94 and 96 are interposed between the IC chip 24 and the edge portions of the cutout at which the DC or low speed lines 56a and 56b are exposed, scrubbing in the upward and downward directions in FIG. 10 can be performed for the IC chip 24 before the metal blocks 94 and 96 are secured to the depression 16b of the second metal member. As a result, it can be prevented that air bubbles are produced in the AuSn eutectic crystal material used for the securing of the IC chip 24, and even where the surface area of an IC chip is comparatively large, when wire bonding is performed, it is avoided that undesirable impact stress may be applied to the IC chip.

Generally, in order to restrain crosstalk between ports of an IC chip, it is effective to make the IC chip large. Meanwhile, in order that a plurality of ports connected by way of shortest bonding wires to a plurality of signal strip lines juxtaposed at predetermined distances from each other may be arranged in a row, it is preferable for the IC chip to have a large size in the direction of such arrangement. According to the present example, such scrubbing as described above is possible, and accordingly, the size of an IC chip can be increased. Consequently, crosstalk between ports can be restrained, and besides, a bonding wire through which a high speed signal passes can be reduced in length. As the size of an IC chip is increased in this instance, or as a plurality of IC chips are used, it is required to increase the size of a circuit board. In the present example, even if the size of a circuit board is increased, since CuW is used as a material for the first and second metal members to which the circuit board is directly secured and the coefficient of linear thermal expansion of CuW is substantially equal to a coefficient of linear thermal expansion, for example, of an alumina ceramics material which is used to make the circuit board, thermal strain does not take place readily at joining portions between the circuit board and the first and second metal members when they undergo a temperature variation. Accordingly, a high temperature joining technique such as welding or brazing can be adopted for the joining between the circuit board and the first and second metal members.

In the present example, since a circuit board basically of the tri-plate type is employed wherein the conductor patterns (signal strip lines, DC or low speed lines and ground patterns) are interposed between the first and second insulator layers 50 and 52 made of a dielectric substance such as alumina ceramics, space crosstalk between the conductor patterns can be restrained effectively.

Further, since the IC chip 24 is secured in the depression 16b of the second metal member by way of the receiving table 68 made of an insulating substance, the potential on the rear face side of the IC chip 24 (substrate potential) and the potential of the second metal member 16 can be made different from each other, and accordingly, it is possible to use an IC chip of the Si type wherein it is necessary to set the substrate potential to a most negative (that is, a potential which may be different from the ground potential). Where AlN having a high thermal conductivity is used as a material of the receiving table 68, it is possible to cope with an increase of heat generation from an IC chip which cannot be secured directly to a metal member.

The reason why the second metal member 16 on which the depressions (16b and so forth) are formed is employed in the present example without using a second metal member which has a flat upper face is such as follows. In particular, if no depression is formed on a metal member, then when a receiving table is to be interposed between an IC chip and the second metal member, the thickness of the first insulator layer 50 must be greater than the thickness of the IC chip 24 in order to minimize the length of bonding wires, and the degree of freedom in designing of a strip line constant and so forth of a circuit board is low. On the other hand, where depressions are formed on a second metal member as in the present example, the thickness of the first insulator layer 50 can be set freely independently of the thickness of the IC chip 24.

With the structure of the accommodating section of the IC chip shown in FIGS. 10 to 12, due to the necessity for the arrangement of the photoelectric transducer element 74, optical fiber and so forth adjacent the IC chip 24, the cutout in which the IC chip 24 is accommodated is in the form of a notch from an outer periphery of the circuit board. However, the cutout may otherwise be in the form of an opening as described subsequently.

Figure 13:
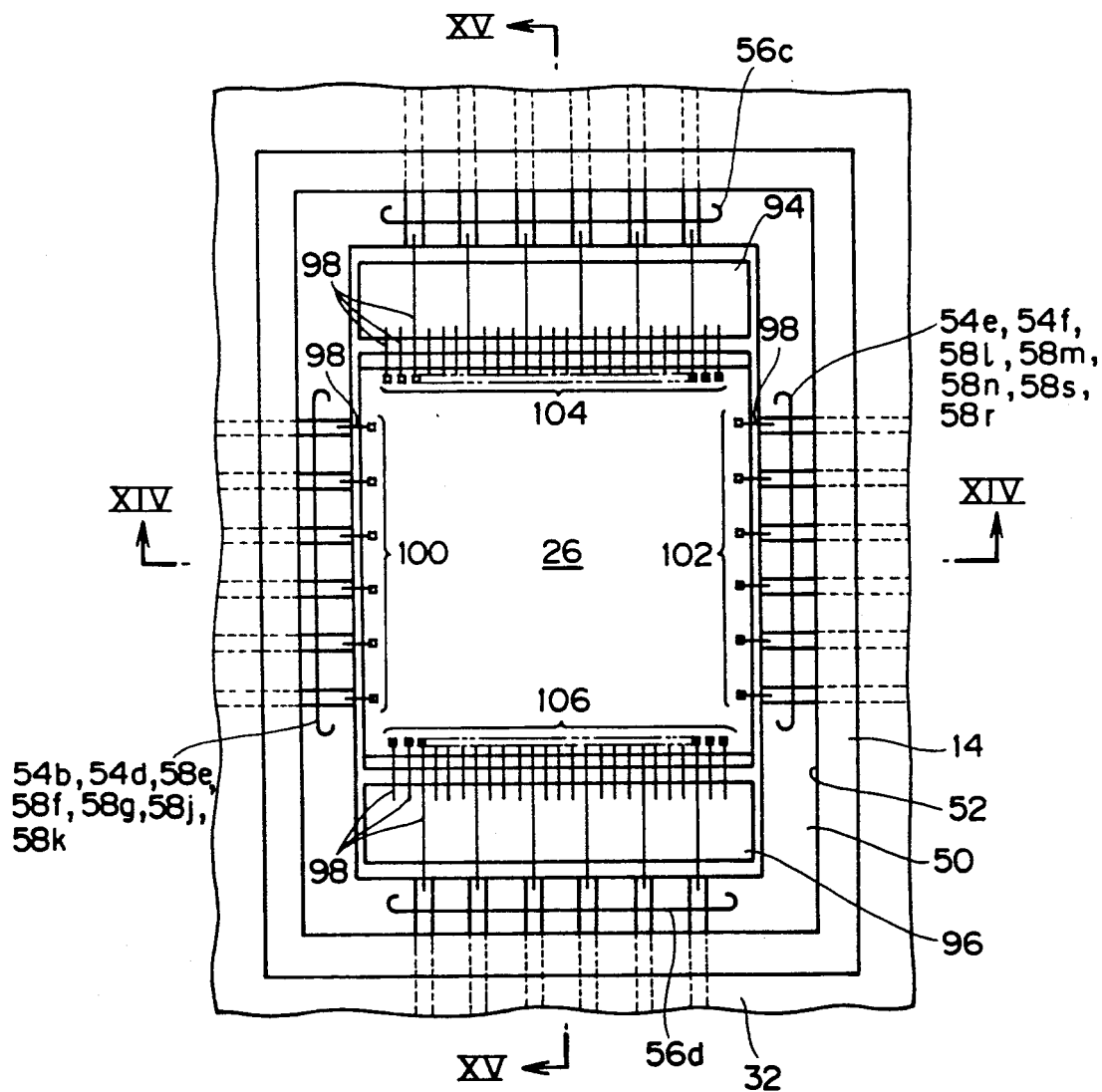
FIG. 13 is a broken plan view showing another example of an accommodating section for an IC chip.
Figure 14:
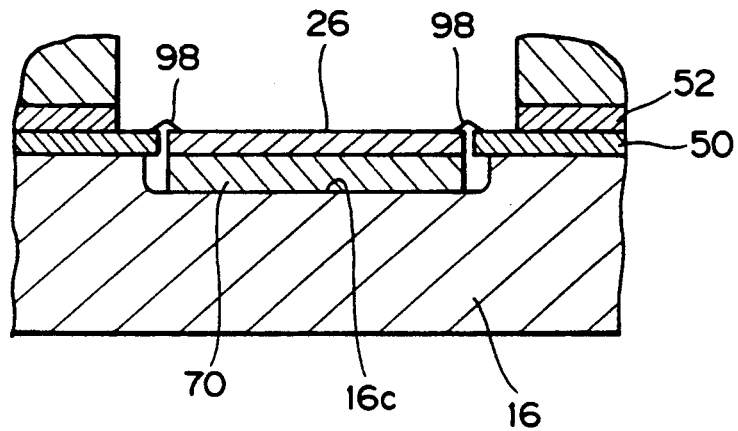
FIG. 14 is an end view along a section taken along line XIV—XIV of FIG. 13.
Figure 15:
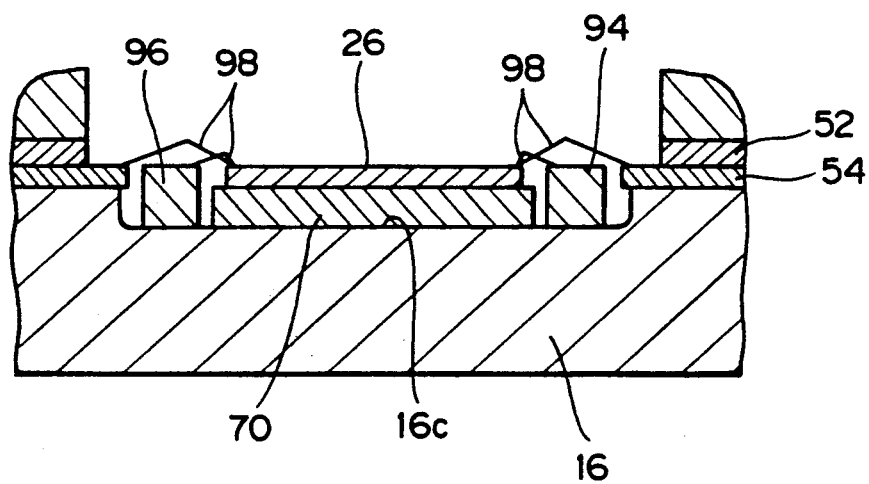
FIG. 15 is an end view along a section taken along line XV—XV of FIG. 13.

FIGS. 13 to 15 are views showing another concrete example of an accommodating portion of an IC chip. FIG. 13 is a broken plan view showing an accommodating portion for an IC chip 26 for a TIM/DEC circuit, FIG. 14 is an end view along a section taken along line XIV—XIV of FIG. 13, and FIG. 15 is an end view along a section taken along line XV—XV of FIG. 13. Reference numeral 100 denotes a high speed signal input port or a ground port of an IC chip 26, and those ports 100 are connected to signal strip lines 54b and 54d and ground patterns 58e, 58f, 58g, 58j and 58k by way of bonding wires 98. Reference numeral 102 denotes a high speed signal output port or a ground port of the IC chip 26, and those ports 102 are connected to signal strip lines 54e and 54f and ground patterns 58l, 58m, 58n, 58s and 58r by way of bonding wires 98. Reference numerals 104 and 106 denote each a low speed signal input/output port, a power supply port or a ground port of the IC chip 26, and those ports 104 and 106 are connected to DC or low speed lines 56c and 56d and metal blocks 94 and 96 by way of bonding wires 98. The metal blocks 94 and 96 are secured in a depression 16c of a second metal member such that they may be interposed between the IC chip 26 and edge portions of the cutout at which the DC or low speed lines 56c and 56d are exposed similarly as in the case of the example shown in FIGS. 10 to 12.

Also in the present example, the IC chip 26 is accommodated with little gaps left in the leftward and rightward directions in FIG. 13 or 14, but since spaces for the metal blocks 94 and 96 are assured, scrubbing can be performed readily when the IC chip 26 is to be secured in the depression 16c of the second metal member. It is to be noted that, since effects of the present example are similar to the effects of the example shown in FIGS. 10 to 12, description thereof is omitted herein. Also an IC chip 28 for an S/P circuit can be accommodated in another cutout similarly as the IC chip 26 for a TIM/DEC circuit.

Figure 16:
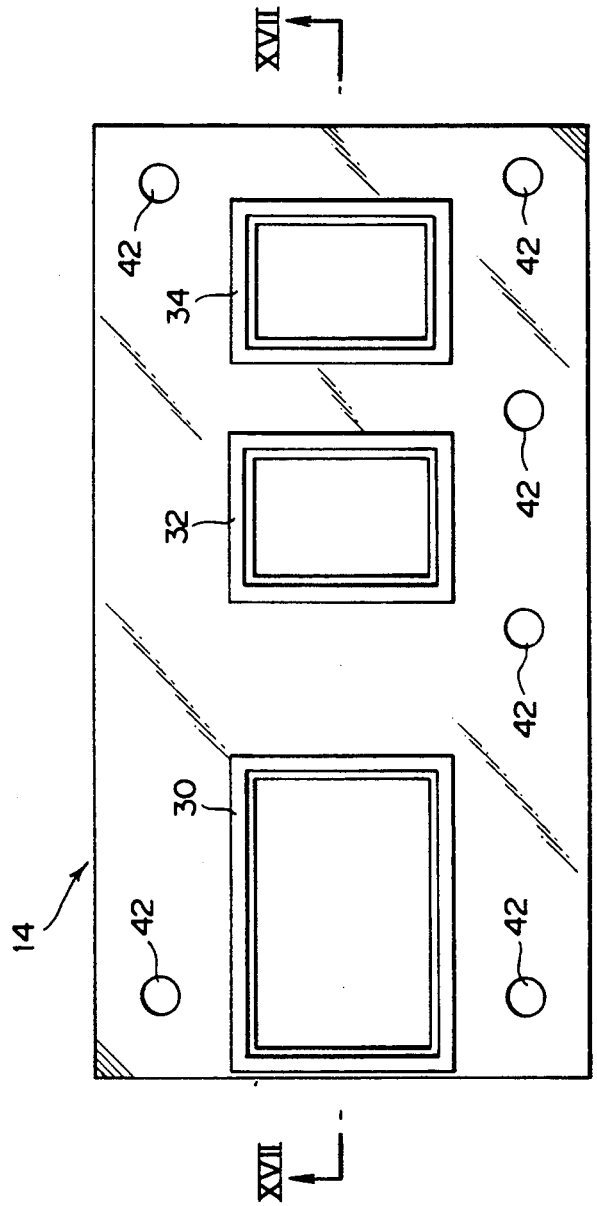
FIG. 16 is a plan view showing a frame member mounted on a first metal member.
Figure 17:
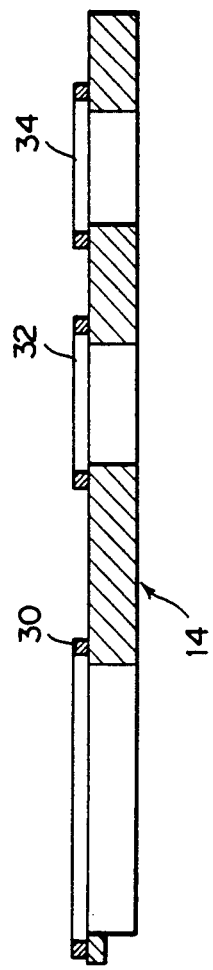
FIG. 17 is a sectional view taken along line XVII—XVII of FIG. 16.

FIG. 16 is a plan view showing the frame members mounted on the first metal member 14, and FIG. 17 is a sectional view taken along line XVII—XVII of FIG. 16. As an opening is formed at each of portions of the first metal member 14 corresponding to the IC chip accommodating portions and optical coupling portion, even after the first metal member 14 is mounted on the circuit board 12, optical adjustment at the optical coupling portion or extraction of a signal for monitoring from each of the IC chips is possible. As the frame members 30, 32 and 34 made of kovar are joined to the first metal member 14 along the openings, the lid members 36 and 38 (shown in FIG. 1) similarly made of kovar can be secured to the frame members 30 and 34, respectively, by laser welding. By provision of a package which is sealed airtight by such structure, the characteristic of the device against an environment such as a high humidity is improved.

Figure 18:
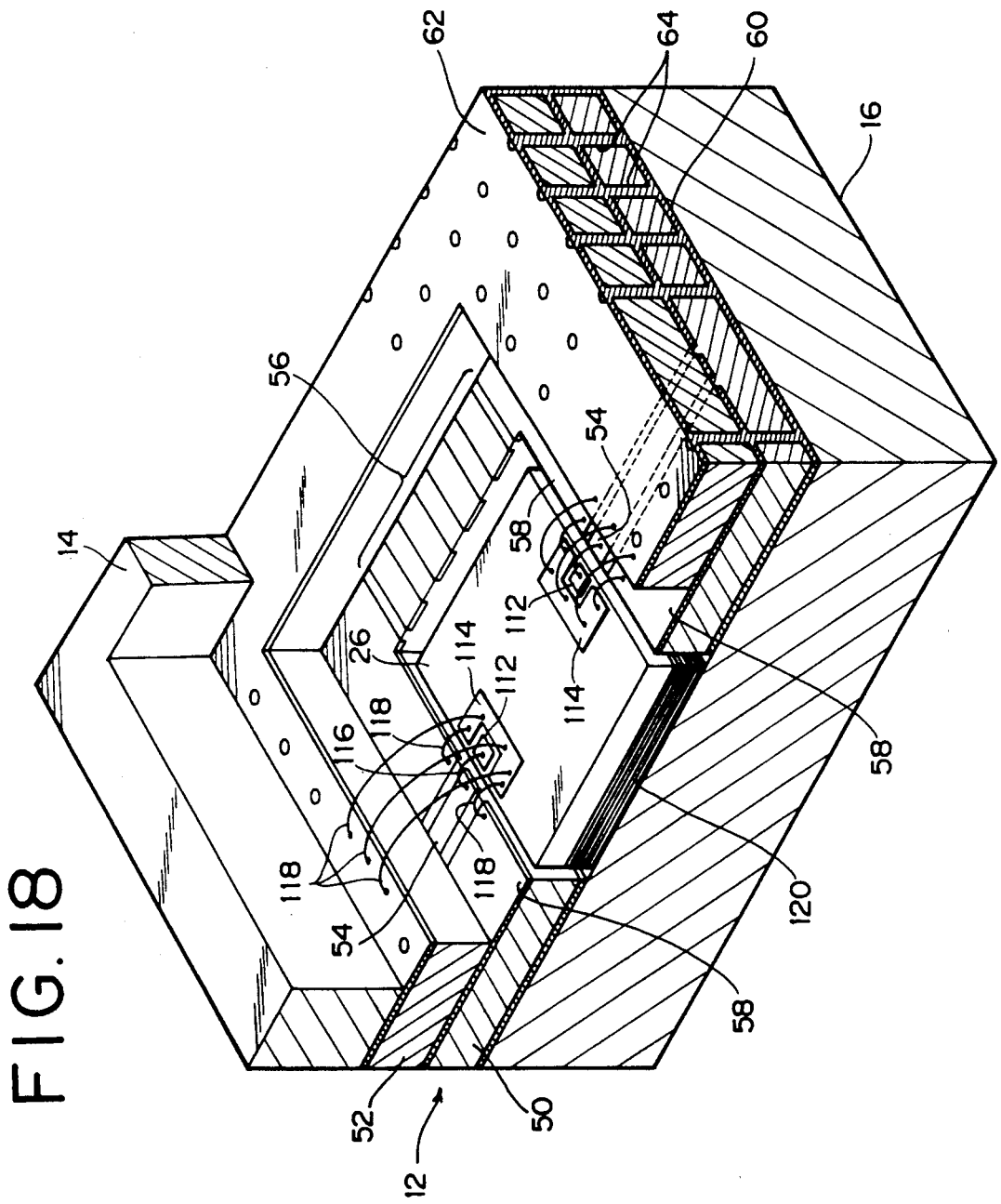
FIG. 18 is a broken perspective view of an electronic circuit package showing another preferred embodiment of the present invention.

FIG. 18 is a broken perspective view of a package showing another preferred embodiment of the present invention and exhibits a modification to the accommodating portion of the IC chip 26. In the present example, a pair of ground ports 114 are provided on an IC chip 26 such that each of them surrounds a high speed signal input/output port 112. Then, the high speed signal input/output ports 112 are individually connected to signal strip lines 54 by way of bonding wires 116 while the ground ports 114 are individually connected to ground patterns 58 and 62 by way of a plurality of bonding wires 118. In order to connect the ground ports 114 and the ground pattern 62 to each other, an opening of a first metal member 14 in the present example is formed a little greater than that of the embodiment described hereinabove.

According to the present construction, since the high speed signal input/output ports 112, the bonding wires 116 and exposed portions of the signal strip lines 54 are surrounded by the bonding wires 118, leakage of a electric field of the signal from the bonding wires 116 and so forth can be shielded to effectively prevent space crosstalk between an input and an output of the IC chip. The plurality of bonding wires 118 may otherwise be disposed such that they cross each other. While in the example shown such high speed signal input/output port 112 is provided one for each of an input and an output, also where it is provided by a plural number for each of an input and an output, space crosstalk between inputs and outputs of the IC chip can be prevented in a similar manner.

By the way, where a receiving table is formed from a uniform unitary insulator member, crosstalk between an input and an output by way of the inside of an IC chip on the receiving table (particularly a portion of a substrate of the chip near a surface) matters sometimes. In view of such regard, in the present example, the receiving table 120 is constituted, as a feature in construction, such that it itself functions as a capacitor so that undesirable crosstalk components may escape from the IC chip 26 to the second metal member 16 by way of the receiving table. The receiving table 120 is composed of a plurality of dielectric layers and conductor layers layered in an alternate relationship to each other. For example, such receiving table 120 can be produced by performing sintering such that dielectric layers made of aluminium nitride and conductor layers may be layered in an alternate relationship to each other. The number of layers is adjusted in accordance with a signal frequency or the like and is, for example, several to several tens. In order to assure insulation in the thicknesswise direction of the receiving table 120 to obtain a suitable capacitance, aluminum nitride is satisfactory as a material for the dielectric layers, and by employing the material, a good heat radiation property for the IC chip 26 can be assured. Further, if it is taken into consideration that the material of the substrate of the IC chip 26 is Si and the material of the second metal member 16 is CuW, it is effective to employ aluminum nitride for the dielectric layers in order to expand the temperature range within which the apparatus can be used. Particularly in the case of a small size IC chip of high integration, the crosstalk characteristic is likely deteriorated due to an arrangement wherein an input port and an output port are disposed in the neighborhood of each other. Besides, since the amount of heat generation per unit surface area is large, it is effective to select the above-mentioned material as the dielectric layers in order to obtain a good crosstalk characteristic and a high heat radiation characteristic.

Figure 19:
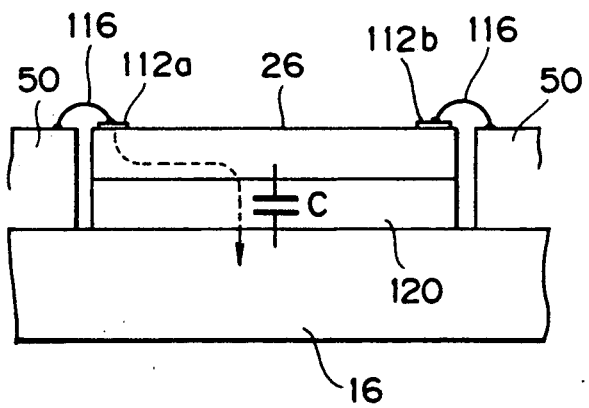
FIG. 19 is an illustrative view when a receiving table of a layer structure is used.

A flow of a crosstalk component is indicated by a broken line in FIG. 19. In the present example, since the receiving table 120 has a high capacitance C comparing with a conventional receiving table which is formed from a unitary insulator member, a crosstalk component from an input port 112a will little reach an output port 112b but will be bypassed to the second metal member 16 which is at the ground potential by way of the capacitance C. Further, in the present example, since the receiving table 120 of a layer structure is employed while the circuit board of the tri-plate type is employed and besides the ground pattern 58 is disposed in the neighborhood of the signal strip lines 54 while the ground patterns 58 are connected by way of a large number of via-contacts 64 with the first and second metal members 14 and 16 having a high potential stability, a crosstalk characteristic which can cope sufficiently with an IC chip for a circuit of a high gain (for example, 60 dB or so) can be assured. As a result, a very high speed system of 5 to 10 Gb/s can be realized comparatively readily.

Figure 20:
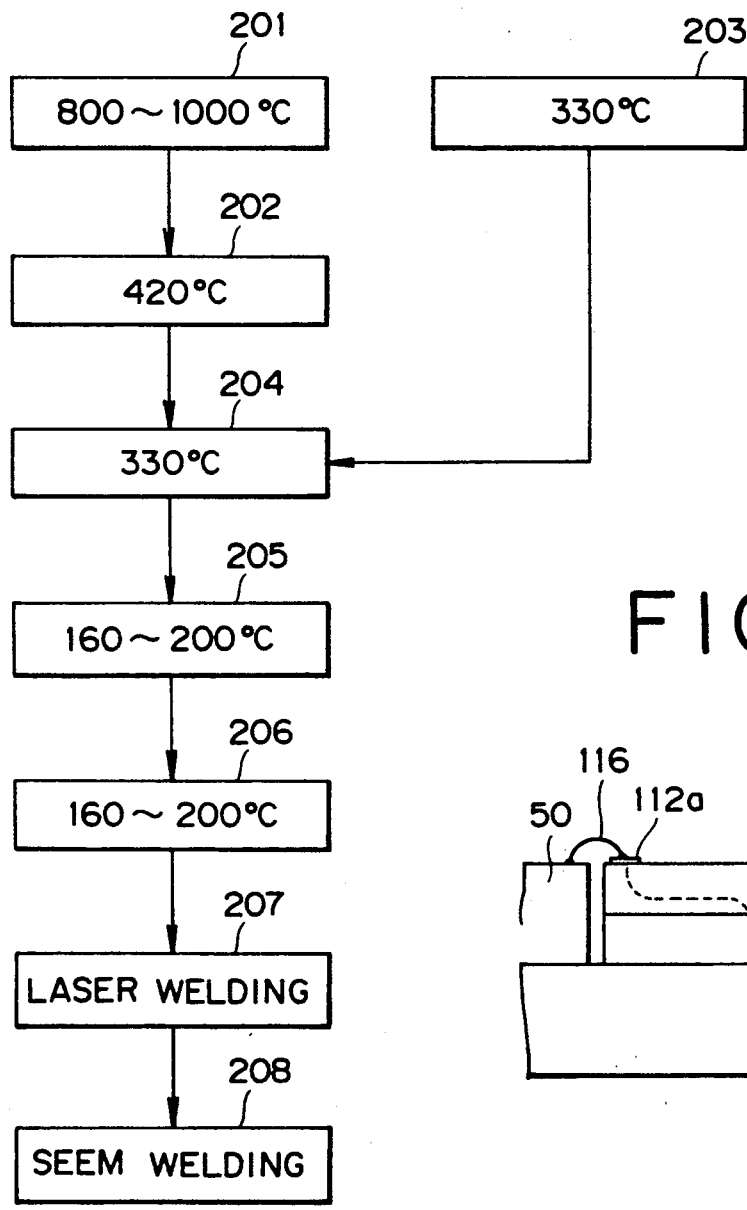
FIG. 20 is a flow chart illustrating an example of a process of producing an electronic circuit package in accordance with the present invention.

Subsequently, an example of a process of producing such package will be described in accordance with a flow chart of FIG. 20.

First at step 201, brazing between a circuit board 12 and first and second metal members 14 and 16, brazing between the second metal member 16 and receiving tables 68, 70 and 72 as well as a chip carrier 66, brazing between frame members 30, 32 and 34 and the first metal member 14 and brazing between a side plate 18 and the first or second metal member are performed at a heating temperature of 800° to 1,000° C. using Ag or an Ag alloy. Those brazing operations may be performed simultaneously or successively in a suitable order.

Subsequently at step 202, IC chips 24, 26 and 28 are joined to the receiving tables 68, 70 and 72, respectively, at a heating temperature of 420° C. using AuSi. Upon such joining, since no metal block is mounted yet, scrubbing can be performed readily for the IC chips. Anticipated effects which can be achieved by scrubbing are such as described hereinabove. In this instance, in case heating to 420° C. is not functionally desirable as in the case of an IC chip of the GaAs type, joining may be performed using an AuSn eutectic crystal material in place of AuSi.

Meanwhile, simultaneously as at steps 201 and 202, flip chip joining between a wiring board 76 and a photoelectric transducer element 74 such as a PIN photodiode is performed at step 203 at a heating temperature of 330° C.

Then at step 204, joining between metal blocks 94 and 96 and the second metal member 16 using an AuSn eutectic crystal material while performing scrubbing and joining between the wiring board 76 and the chip carrier 66 using an AuSn eutectic crystal material while performing scrubbing are performed at a heating temperature of 330° C.

After then, at step 205, connection between the IC chips 24, 26 and 28 and the circuit board 12 and metal blocks 94 and 96 by means of wire bonding is performed at a heating temperature of 160° to 200° C.

Subsequently at step 206, connection between the IC chip 24 and the wiring board 76 by means of wire bonding is performed at a heating temperature of 160° to 200° C.

Then at step 207, a pipe member 20 in and to which an optical fiber 78 is inserted and secured is introduced into a cutout of the circuit board 12 by way of an introduction hold 18a of the side plate 18, and then optical adjustment is performed by movement and rotation of the optical fiber so that a maximum optical coupling efficiency may be obtained, whereafter the pipe member 20 or a flange thereof is laser welded to the side plate 18.

Finally at step 208, lid members are individually seam welded to the frame members 30, 32 and 34.

By performing assembling of various components in an order from a high temperature using a plurality of joining techniques such that secured portions may not be separated from each other, an IC package for which a high assembly accuracy is required in order to assure a high speed operation performance can be produced readily.

In the process of production described above, at step 204, or in some cases at step 202 in place of step 204, joining using an AuSn eutectic crystal material is adopted. However, in case an operation at a room temperature is required, joining using silver (Ag) paste bond while performing scrubbing can be adopted in place of joining using an AuSn eutectic crystal material. Ag paste bond is a mixture of Ag powder, solvent and resin binder, and where such Ag paste bond is employed, firm fixation can be achieved by adhering an object part to a predetermined location at a room temperature and then evaporating the solvent at a heating temperature, for example, of 180° C. In this instance, scrubbing is performed while the Ag paste bond remains in an adhesive condition.

While in the foregoing description the present invention is described in connection with the particular embodiments thereof, the present invention is not limited to the details of the embodiments. For example, the via-contacts may not be formed over the entire areas of the ground patterns but may be formed only in regions of the ground patterns in the neighborhood of the signal strip lines. Further, while part of the signal strip lines and all of the Dc or low speed lines are connected to the package leads on the edge portions of the outer periphery of the circuit board, where the signal strip lines are not exposed on the edge portions of the outer periphery of the circuit board, only the DC or low speed lines may be connected to the package leads. Further, not only the construction wherein the receiving tables for the individual IC chips are formed separately from the second metal member but also the construction wherein the receiving tables are formed in an integral relationship with the second metal member remain within the scope of the present invention. While in the description of the embodiments so far the electronic circuit part is an IC chip, also the construction wherein some other electronic circuit part such as a timing filter or a microchip capacitor is accommodated in a cutout of the circuit board remains within the scope of the present invention.

In this manner, the preferred embodiments disclosed in the present patent application is only illustrative but not restrictive. The scope of the present invention is defined by the appended claims, and modifications and alterations which belong to an equivalent range of the claims all remain within the scope of the present invention.

What is claimed is:

1. An electronic circuit package, comprising:
    a circuit board having a top surface, a bottom surface and a cutout in which an electronic circuit part is accommodated;
    a first conductive metal member disposed above the top surface of said circuit board; and
    a second conductive metal member disposed below a whole of the bottom surface of said circuit board.

2. An electronic circuit package according to claim 1, wherein said circuit board includes a first insulator layer having conductor patterns formed on a surface thereof, and a second insulator layer adhered or stuck to said first insulator layer in such a manner as to cover over said conductor patterns except edge portions of an outer periphery of said circuit board and edge portions of said cutout.

3. An electronic circuit package according to claim 2, wherein portions of said conductor patterns on said edge portions of said cutout are connected to said electronic circuit part accommodated in said cutout, and portions of said conductor patterns on said edge portions of said outer periphery of said circuit board are connected to package leads.

4. An electronic circuit package according to claim 1, wherein said circuit board has a plurality of such cutouts.

5. An electronic circuit package according to claim 4, wherein said first metal member has openings at locations corresponding to said cutouts of said circuit board, and said second metal member has spaces at locations corresponding to said cutouts, to which such electronic circuit parts are to be secured.

6. An electronic circuit package according to claim 5, wherein each of said openings is covered with a lid member made of a metal.

7. An electronic circuit package according to claim 6, wherein said circuit board includes a first insulator layer having conductor patterns formed on a surface thereof, and a second insulator layer adhered or stuck to said first insulator layer in such a manner as to cover over said conductor patterns except edge portions of an outer periphery of said circuit board and edge portions of said cutouts.

8. An electronic circuit package according to claim 7, wherein said conductor patterns include signal strip lines having end portions exposed on a pair of opposing edge portions of each of said cutouts, DC or low speed lines having end portions exposed on edge portions of each of said cutouts opposing to said edge portions of said outer periphery of said circuit board, and ground patterns formed in areas other than areas in which said signal strip lines and DC or low speed lines are formed such that said ground patterns do not contact with any of said signal strip lines and DC or low speed lines.

9. An electronic circuit package according to claim 8, wherein each of the electronic circuit parts is an IC chip, and portions of said signal strip lines on said edge portions of said cutouts are connected to high speed signal input/output ports of the IC chips while portions of said DC or low speed lines on said edge portions of said cutouts are connected to low speed signal input/output ports and power supply ports of said IC chips and portions of said signal strip lines and/or DC or low speed lines on said edge portions of said outer periphery of said circuit board are connected to package leads.

10. An electronic circuit package according to claim 9, wherein a metal block is interposed between each of said IC chips and an edge portion of a corresponding one of said cutouts on which said edge portions of said DC or low speed lines are exposed and is secured to said second metal member, and a ground port of a corresponding one of said IC chips is connected to said metal block.

11. An electronic circuit package according to claim 10, wherein a large number of via-contacts extending through said first and second insulator layers to establish connection with said first and second metal members are provided at least in areas of said ground patterns in the neighborhood of said signal strip lines.

12. An electronic circuit package according to claim 10, wherein a large number of via-contacts extending through said first and second insulator layers to establish connection with said first and second metal members are provided in entire areas of said ground patterns.

13. An electronic circuit package according to claim 11, wherein ground patterns with which said via-contacts connect are formed on the opposite faces of said first and second insulator layers to said conductor patterns, and the connection between said via-contacts and said first and second metal members is provided by sticking together with said ground patterns and said first and second metal members.

14. An electronic circuit package according to claim 13, wherein a ground port provided on each of said IC chips in such a manner as to surround said high speed signal input/output port is connected to a corresponding one of said ground patterns by way of a plurality of bonding wires.

15. An electronic circuit package, comprising:
    first and second conductive metal members, and
    a circuit board disposed between said first and second metal members and having a cutout in which an electronic circuit part is accommodated, and wherein said circuit board has a plurality of such cutouts,
    wherein said first metal member has openings at locations corresponding to said cutouts of said circuit board, and said second metal member has spaces at locations corresponding to said cutouts, to which such electronic circuit parts are to be secured,
    wherein each of said openings is covered with a lid member made of a metal,
    wherein said circuit board includes a first insulator layer having conductor patterns formed on a surface thereof, and a second insulator layer adhered or stuck to said first insulator layer in such a manner as to cover over said conductor patterns except edge portions of an outer periphery of said circuit board and edge portions of said cutouts,
    wherein said conductor patterns include signal strip lines having end portions exposed on a pair of opposing edge portions of each of said cutouts, DC or low speed lines having end portions exposed on edge portions of each of said cutouts opposing to said edge portions of said outer periphery of said circuit board, and ground patterns formed in areas other than areas in which said signal strip lines and DC or low speed lines are formed such that said ground patterns do not contact with any of said signal strip lines and DC or low speed lines, wherein each of the electronic circuit parts is an IC chip, and portions of said signal strip lines on said edge portions of said cutouts are connected to high speed signal input/output ports of the IC chips while portions of said DC or low speed lines on said edge portions of said cutouts are connected to low speed signal input/output ports and power supply ports of said IC chips and portions of said signal strip lines and/or DC or low speed lines on said edge portions of said outer periphery of said circuit board are connected to package leads, wherein a metal block is interposed between each of said IC chips and an edge portion of a corresponding one of said cutouts on which said edge portions of said DC or low speed lines are exposed and is secured to said second metal member, and a ground port of a corresponding one of said IC chips is connected to said metal block, wherein a large number of via-contacts extending through said first and second insulator layers to establish connection with said first and second metal members are provided at least in areas of said ground patterns in the neighborhood of said signal strip lines, and wherein an optical fiber is introduced into the inside of one of said cutouts.

16. An electronic circuit package according to claim 15, wherein a photoelectric transducer element is disposed in the inside of the cutout into which said optical fiber is introduced.

17. An electronic circuit package according to claim 16, wherein a mirror or a prism is disposed inside of the cutout in such a manner that the distance between the surface of the photoelectric transducer element and the fiber end can be inspected from the view point perpendicular to the cutout of the package, by way of the reflection of said mirror or prism.

18. An electronic circuit package according to claim 16, wherein said photoelectric transducer element is connected to the IC chip accommodated in said cutout, and said optical fiber and said photoelectric transducer element are optically coupled to each other such that light which is reflected by an end face of said optical fiber which is polished obliquely with respect to a plane perpendicular to a geometrical center axis of said optical fiber and is then emitted from a side face of said optical fiber is introduced into said photoelectric transducer element.

19. An electronic circuit package according to claim 9, wherein the IC chips are secured to said second metal member each by way of a receiving table of a predetermined thickness such that the high speed signal input/output ports and signal strip lines are positioned substantially on the same plane.

20. An electronic circuit package according to claim 19, wherein the receiving tables are integral with said second metal member.

21. An electronic circuit package according to claim 19, wherein the receiving tables are separate members from said second metal member.

22. An electronic circuit package according to claim 21, wherein said receiving tables are made of an insulating substance.

23. An electronic circuit package according to claim 21, wherein each of said receiving tables include a plurality of dielectric layers and conductor layers layered in an alternate relationship to each other.

24. An electronic circuit package according to claim 23, wherein said dielectric layers are made of aluminum nitride.

25. An electronic circuit package according to claim 24, wherein the substrate of each of said IC chips is made of silicon.

26. An electronic circuit package according to claim 9, wherein the number of the cutouts is 3, and the IC chips include an IC chip for the amplification, another IC chip for the timing/decision, and a further IC chip for the serial/parallel conversion.

27. An electronic circuit package, comprising:

first and second conductive metal members, and a circuit board disposed between said first and second metal members and having a cutout in which an electronic circuit part is accommodated, and wherein said circuit board has a plurality of such cutouts, wherein said first metal member has openings at locations corresponding to said cutouts of said circuit board, and said second metal member has spaces at locations corresponding to said cutouts, to which such electronic circuit parts are to be secured, wherein each of said openings is covered with a lid member made of a metal, wherein said circuit board includes a first insulator layer having conductor patterns formed on a surface thereof, and a second insulator layer adhered or stuck to said first insulator layer in such a manner as to cover over said conductor patterns except edge portions of an outer periphery of said circuit board and edge portions of said cutouts, wherein said conductor patterns include signal strip lines having end portions exposed on a pair of opposing edge portions of each of said cutouts, DC or low speed lines having end portions exposed on edge portions of each of said cutouts opposing to said edge portions of said outer periphery of said circuit board, and ground patterns formed in areas other than areas in which said signal strip lines and DC or low speed lines are formed such that said ground patterns do not contact with any of said signal strip lines and DC or low speed lines, wherein each of the electronic circuit parts is an IC chip, and portions of said signal strip lines on said edge portions of said cutouts are connected to high speed signal input/output ports of the IC chips while portions of said DC or low speed lines on said edge portions of said cutouts are connected to low speed signal input/output ports and power supply ports of said IC chips and portions of said signal strip lines and/or DC or low speed lines on said edge portions of said outer periphery of said circuit board are connected to package leads, wherein the number of the cutouts is 3, and the IC chips include an IC chip for the amplification, another IC chip for the timing/decision, and a further IC chip for the serial/parallel conversion, and wherein an optical fiber is introduced into one of the cutouts in which said IC chip for the amplification is accommodated.

28. An electronic circuit package according to claim 27, wherein a photoelectric transducer element is disposed in the inside of said cutout into which said optical fiber is introduced.

29. An electronic circuit package according to claim 28, wherein said photoelectric transducer element is connected to said IC chip for the amplification, and said optical fiber and said photoelectric transducer element are optically coupled to each other such that light which is reflected by an end face of said optical fiber which is polished obliquely with respect to a plane perpendicular to a geometrical center axis of said optical fiber and is then emitted from a side face of said optical fiber is introduced into said photoelectric transducer element.

30. An electronic circuit package, comprising:
- a circuit board having a top surface, a bottom surface and a cutout formed as a notch at an edge portion of said circuit board and in which an electronic circuit part is accommodated;
- a first conductive metal member disposed above the top surface of said circuit board; and
- a second conductive metal member disposed below the bottom surface of said circuit board.

* * * * *